United States Patent
Lee

(10) Patent No.: US 9,728,265 B2
(45) Date of Patent: Aug. 8, 2017

(54) STORAGE DEVICE AND OPERATING METHOD THEREOF

(71) Applicant: SK hynix Inc., Icheon-si Gyeonggi-do (KR)

(72) Inventor: Yeonghun Lee, Seongnam-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 15/055,906

(22) Filed: Feb. 29, 2016

(65) Prior Publication Data

US 2017/0084341 A1    Mar. 23, 2017

(30) Foreign Application Priority Data

Sep. 17, 2015  (KR) .................. 10-2015-0131700

(51) Int. Cl.
| | | |
|---|---|---|
| G11C 16/06 | (2006.01) | |
| G11C 16/26 | (2006.01) | |
| G11C 16/08 | (2006.01) | |
| G11C 16/04 | (2006.01) | |

(52) U.S. Cl.
CPC ............. *G11C 16/26* (2013.01); *G11C 16/08* (2013.01); *G11C 16/0483* (2013.01)

(58) Field of Classification Search
CPC ............ G11C 16/00; G11C 7/06; G11C 16/26
USPC ................ 365/185.21, 185.22, 196
See application file for complete search history.

(56) References Cited

U.S. PATENT DOCUMENTS

| | | | | |
|---|---|---|---|---|
| 2005/0254302 A1* | 11/2005 | Noguchi | ............... | G11C 16/08 365/185.17 |
| 2008/0316818 A1* | 12/2008 | Park | .................. | G11C 16/3418 365/185.03 |
| 2009/0052257 A1* | 2/2009 | Park | .................. | G11C 16/0483 365/185.23 |
| 2011/0317489 A1* | 12/2011 | Kim | .................. | G11C 16/0483 365/185.18 |
| 2013/0242661 A1* | 9/2013 | Lei | ......................... | G11C 16/26 365/185.17 |
| 2015/0078080 A1* | 3/2015 | Lee | ......................... | G11C 11/56 365/185.03 |
| 2015/0085584 A1* | 3/2015 | Choi | ..................... | G11C 16/26 365/185.21 |

FOREIGN PATENT DOCUMENTS

KR       1020090000394 A       1/2009

* cited by examiner

*Primary Examiner* — Han Yang
(74) *Attorney, Agent, or Firm* — William Park & Associates Ltd.

(57) ABSTRACT

There are provided a storage device and an operating method thereof. A storage device includes a string including a plurality of memory cells, peripheral circuits for, in a read operation of a selected memory cell, applying a read voltage to a selected word line electrically coupled to the selected memory cell, and selectively applying a first pass voltage and a second pass voltage higher than the first pass voltage to unselected word lines electrically coupled to the other unselected memory cells according to a position of the selected word line, and a controller for controlling the peripheral circuits.

10 Claims, 15 Drawing Sheets

STORAGE DEVICE AND OPERATING METHOD THEREOF

CROSS-REFERENCE TO RELATED APPLICATION

The present application claims priority to Korean patent application number 10-2015-0131700 filed on Sep. 17, 2015, in the Korean Intellectual Property Office, the entire disclosure of which is incorporated by reference herein.

BACKGROUND

1. Field

An aspect of the invention relates to a storage device and an operating method thereof, and more particularly, to a read operation of a storage device.

2. Description of the Related Art

A storage device may include a memory cell array configured to store data, a peripheral circuit configured to perform a program, erase, or read operation, and a controller configured to control the peripheral circuit.

The memory cell array may include a plurality of memory blocks, and each of the plurality of memory blocks may include a plurality of strings each including memory cells. The strings may be formed into a two-dimensional or three-dimensional structure. Two-dimensional strings may be formed into a structure in which memory cells are arranged horizontally to a substrate, and three-dimensional strings may be formed into a structure in which memory cells are arranged perpendicularly to a substrate.

The controller controls the peripheral circuit to perform a program, an erase, or a read operation in response to a memory command received from the outside (e.g., a memory controller).

In order for the storage device to be used in small-sized electronic devices, the integration degree of the storage device is gradually increased. As electrical characteristics of the storage device are degraded due to an increase in integration degree, the reliability of the storage device may be deteriorated.

SUMMARY

According to an aspect of the invention, there is provided a storage device including a string configured to include a plurality of memory cells. The storage device also includes peripheral circuits configured to, in a read operation of a selected memory cell, apply a read voltage to a selected word line electrically coupled to the selected memory cell, and selectively apply a first pass voltage and a second pass voltage higher than the first pass voltage to unselected word lines electrically coupled to the other unselected memory cells according to a position of the selected word line. The storage device also includes a controller configured to control the peripheral circuits.

According to an aspect of the invention, there is provided a storage device including a plurality of memory cells electrically coupled between a drain select transistor and a source select transistor. The storage device also includes peripheral circuits configured to perform a read operation of a selected memory cell. The storage device also includes a controller configured to control the peripheral circuits to, in the read operation, apply a first pass voltage, a second pass voltage, or the first and second pass voltages to unselected word lines electrically coupled to unselected memory cells according to a position of the selected memory cell.

According to an aspect of the invention, there is provided a method of operating a storage device, the method including reading a selected memory cell. The method also includes adjusting a pass voltage applied to unselected word lines electrically coupled to unselected memory cells according to a position of the selected memory cell.

DETAILED DESCRIPTION

Hereinafter embodiments of the invention will be described in detail with reference to the accompanying figures. However, the invention is not limited to the embodiments but may be implemented into different forms. These embodiments are provided only for illustrative purposes and for full understanding of the scope of the invention by those skilled in the art. Embodiments provide a storage device and an operating method thereof, in which when a read operation of the storage device is performed, a pass voltage applied to unselected word lines is adjusted, thereby improving the reliability of the read operation.

Figure 1:
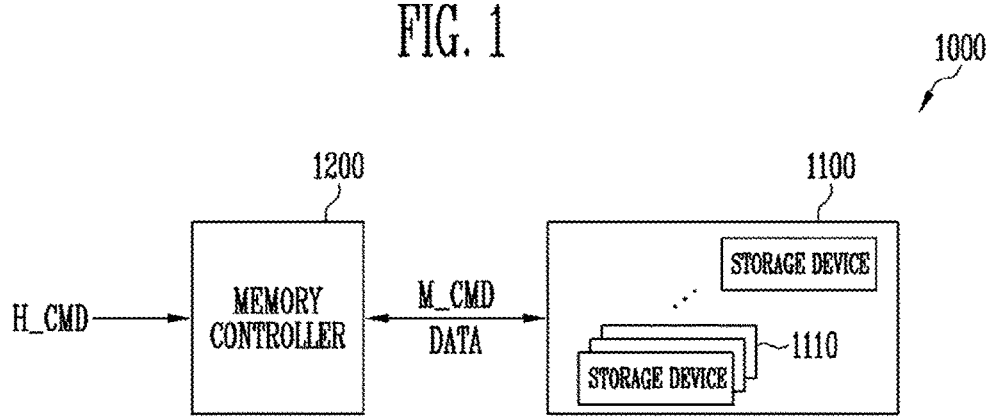
FIG. 1 is a diagram illustrating a memory system according to an embodiment of the invention.

Referring to FIG. 1, is a diagram illustrating a memory system according to an embodiment of the invention is illustrated.

In FIG. 1, the memory system 1000 may include a memory device 1100 and a memory controller 1200.

The memory device 1100 may include a plurality of storage device 1110. The storage devices 1110 may include a double data rate synchronous dynamic random access memory (DDR SDRAM), a low power double data rate 4 (LPDDR4) SDRAM, a graphics double data rate (GDDR)

SRAM, a low power DDR (LPDDR), a rambus dynamic random access memory (RDRAM), and a flash memory.

The memory controller 1200 may control overall operations of the memory device 1100. The memory controller 1200 may apply a memory command M_CMD and data DATA to the memory device 1100; or receive data DATA from the memory device 1100 in response to a host command H_CMD received from a host.

Although not shown, the host may communicate with the memory system 1000 by using an interface protocol such as peripheral component interconnect-express (PCI-E), advanced technology attachment (ATA), serial ATA (SATA), parallel ATA (PATA), or serial attached SCSI (SAS).

The storage device 1110 may perform a program, read, or erase operation in response to the memory command M_CMD and the data DATA received from the memory controller 1200.

Figure 2:
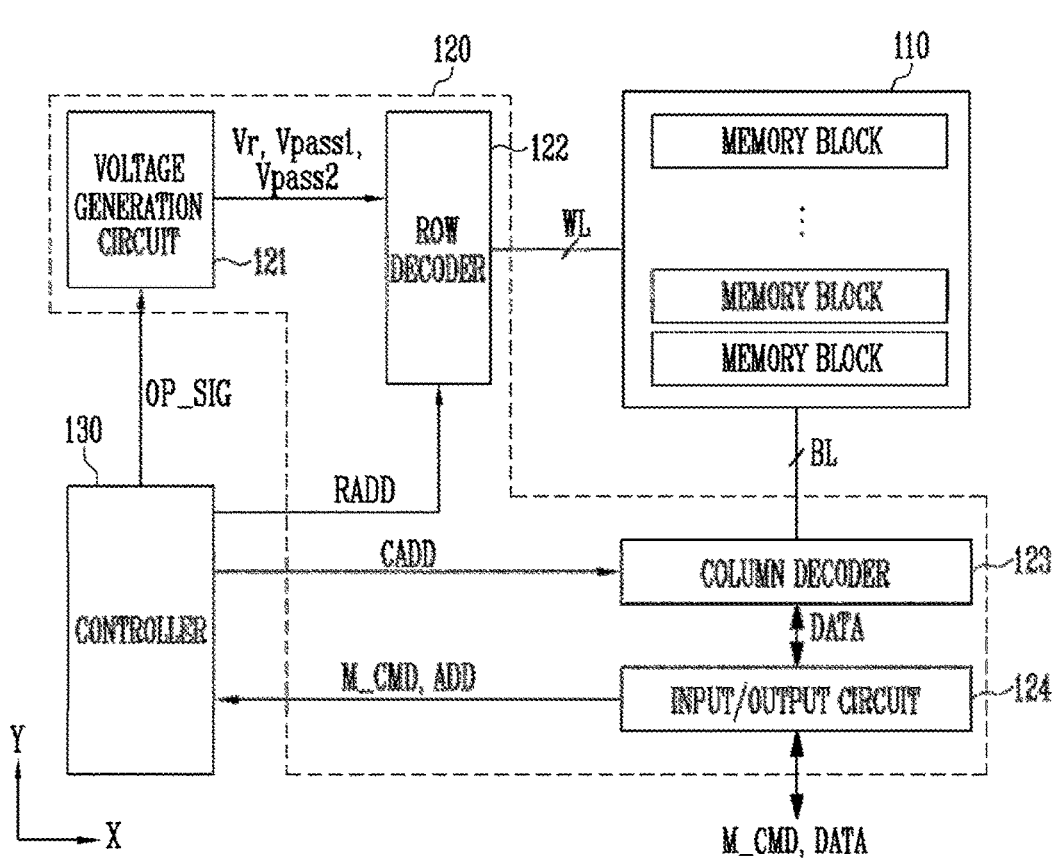
FIG. 2 is a diagram illustrating a storage device of FIG. 1.

Referring to FIG. 2, a diagram illustrating the storage device of FIG. 1 is illustrated.

In FIG. 2, a case where the memory device 1100 is a flash memory will be described as an example.

The memory device 1100 may include a memory cell 110 configured to store data, peripheral circuits 120 configured to program data, read stored data, or erase data, and a controller 130 configured to control the peripheral circuits 120.

The memory cell array 110 may include a plurality of memory blocks. Word lines WL and bit lines BL may be electrically coupled to the memory blocks. The word lines WL are electrically coupled to the respective memory blocks, and the bit lines are commonly electrically coupled to the memory blocks. The memory blocks may include cells strings having a two-dimensional or three-dimensional structure. A plurality of memory cells are included in the cell strings. In the cell strings having the two-dimensional structure, memory cells are arranged horizontally to a substrate. In the three-dimensional cell strings, memory cells are arranged perpendicularly to a substrate.

The peripheral circuit 120 may include a voltage generation circuit 121, a row decoder 122, a column decoder 123, and an input/output circuit 124.

The voltage generation circuit 121 generates operation voltages Vr, Vpass1, and Vpass2 having various levels, which are used for program, read, and erase operations in response to an operation signal OP_SIG. The read operation will be described as an example. The voltage generation circuit 121 may generate a read voltage Vr, a first pass voltage Vpass1, and a second pass voltage Vpass2. In addition, the voltage generation circuit 121 may generate voltages having various levels. The first pass voltage Vpass1 may be set as a positive voltage higher than 0V. In addition, the second pass voltage Vpass2 may be set as a positive voltage higher than the first pass voltage Vpass1. Alternatively, the first pass voltage Vpass1 may be set between 0V and the second pass voltage Vpass2.

The row decoder 122 transmits operation voltages Vop to a word line WL electrically coupled to a selected memory block in respect to a row address RADD.

The column decoder 123 transmits/receives data to/from a selected memory block through the bit lines BL in response to a column address CADD.

The input/output circuit 124 may receive a memory command M_CMD and data DATA from the memory controller 1200, transmit the memory command M_CMD and the data DATA to the controller 130, and transmit/receive data DATA to/from the column decoder 123. An address ADD may be included in the data DATA received to the input/output circuit 124.

The controller 130 may control the peripheral circuits 120 by outputting an operation signal OP_SIG, a row address RADD, and a column address CADD. In particular, in a read operation of the controller 130, the controller 130 may control the peripheral circuits 120 to adjust the level of a pass voltage applied to unselected word lines according to the position of a selected word line (or selected memory cell). For example, in the read operation, the controller 130 may control the peripheral circuits 120 such that, when a read voltage is applied to a selected word line, a pass voltage higher than that applied to unselected word lines electrically coupled to a drain area of a string is applied to unselected word lines electrically coupled to a source area of the string. The source area of the string may mean an area to which a source line is electrically coupled. Further, the drain area of the string may mean an area electrically coupled to which a bit line is electrically coupled. The controller 130 may control the peripheral circuits 120 such that, in a string divided into source and drain areas, the same pass voltage or different pass voltages are applied to all unselected word lines according to an area in which a selected word line is included.

Figure 3:
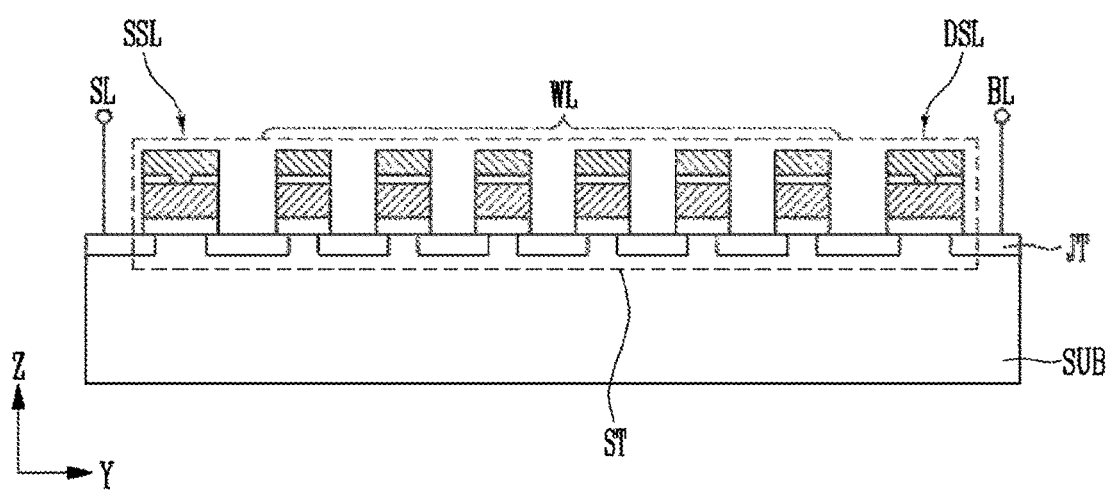
FIG. 3 is a sectional view illustrating an embodiment in which memory blocks of FIG. 2 are implemented in a two-dimensional structure.

Referring to FIG. 3, a sectional view illustrating an embodiment in which the memory blocks of FIG. 2 are implemented in a two-dimensional structure is illustrated.

In FIG. 3, the memory block implemented in the two-dimensional structure may include a string ST formed horizontally (Y direction) on a substrate SUB. For example, the string ST may include a plurality of memory cells, and the memory cells may be arranged horizontally on the substrate SUB.

More specifically, the string ST may include a source select transistor, memory cells, and a drain select transistor, respectively electrically coupled to a source select line SSL, word lines WL, and a drain select line DSL, arranged between a bit line BL and a source line SL. A junction area JT may be formed in the substrate SUB between the source select transistor, the memory cells, and the drain select transistor.

A gate of the source select transistor may be electrically coupled to the source select line SSL, and gates of the memory cells may be electrically coupled to the word lines WL. A gate of the drain select transistor may be electrically coupled to the drain select line DSL. The bit line BL is electrically coupled to a drain junction area JT of the drain select line. Further, the source line SL is electrically coupled to a source junction area JT of the source select line.

More specifically, the source select transistor, the memory cells, and the drain select transistor may include tunnel insulating layers, floating gates, dielectric layers, and control gates, sequentially stacked (Z direction) on the substrate SUB. The tunnel insulating layers may be formed of an oxide layer, and the floating gates and the control gates may be formed of a doped polysilicon layer. The dielectric layers may be formed into a stacked structure of an oxide layer, a nitride layer, and an oxide layer, or formed of a high dielectric (high-k) layer. In the source select transistors electrically coupled to the source select line SSL and the drain select transistors electrically coupled to the drain select lines DSL, a portion of the dielectric layers may be removed; and therefore, the floating gates and the control gates may be contacted with each other. In the memory cells electrically coupled to the word lines WL, the floating gates and the control gates may be isolated from each other by the dielectric layers.

Figure 4:
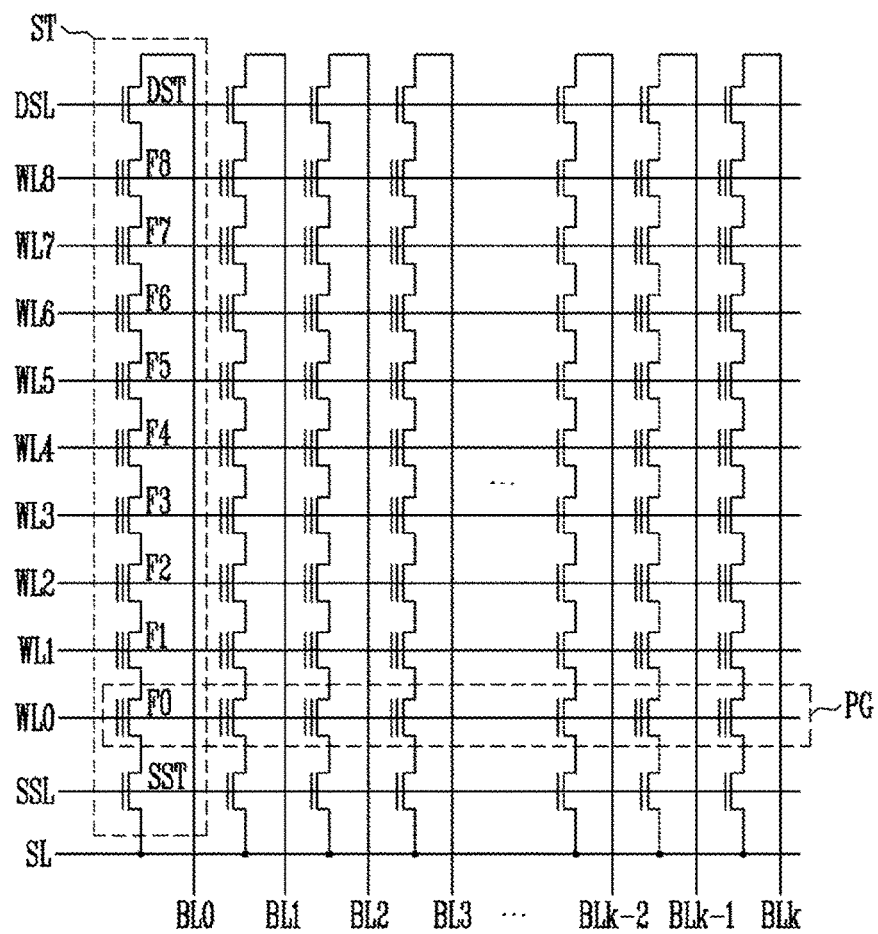
FIG. 4 is a circuit diagram specifically illustrating the memory block implemented in the two-dimensional structure in FIG. 3.

Referring to FIG. 4, a circuit diagram specifically illustrating the memory block implemented in the two-dimensional structure in FIG. 3 is described.

In FIG. 4, the memory block includes a plurality of strings electrically connected between bit lines BL0 to BLk and a source line SL. Any one string ST among these strings will be described as an example.

The string ST includes a source select transistor SST, memory cells F0 to F8, and a drain select transistor DST, electrically coupled in series between the source line SL and the bit line BL0. A gate of the source select transistor SST is electrically coupled to a source select line SSL, and gates of the memory cells F0 to F8 are electrically coupled to word lines WL0 to WL8. A gate of the drain select transistor DST is electrically coupled to a drain select line DSL. A group of memory cells electrically coupled to different strings ST is referred to as a page PG. The number of the source select transistor SST, the memory cells F0 to F8, and the drain select transistor DST may vary according to storage devices.

Figure 5A:
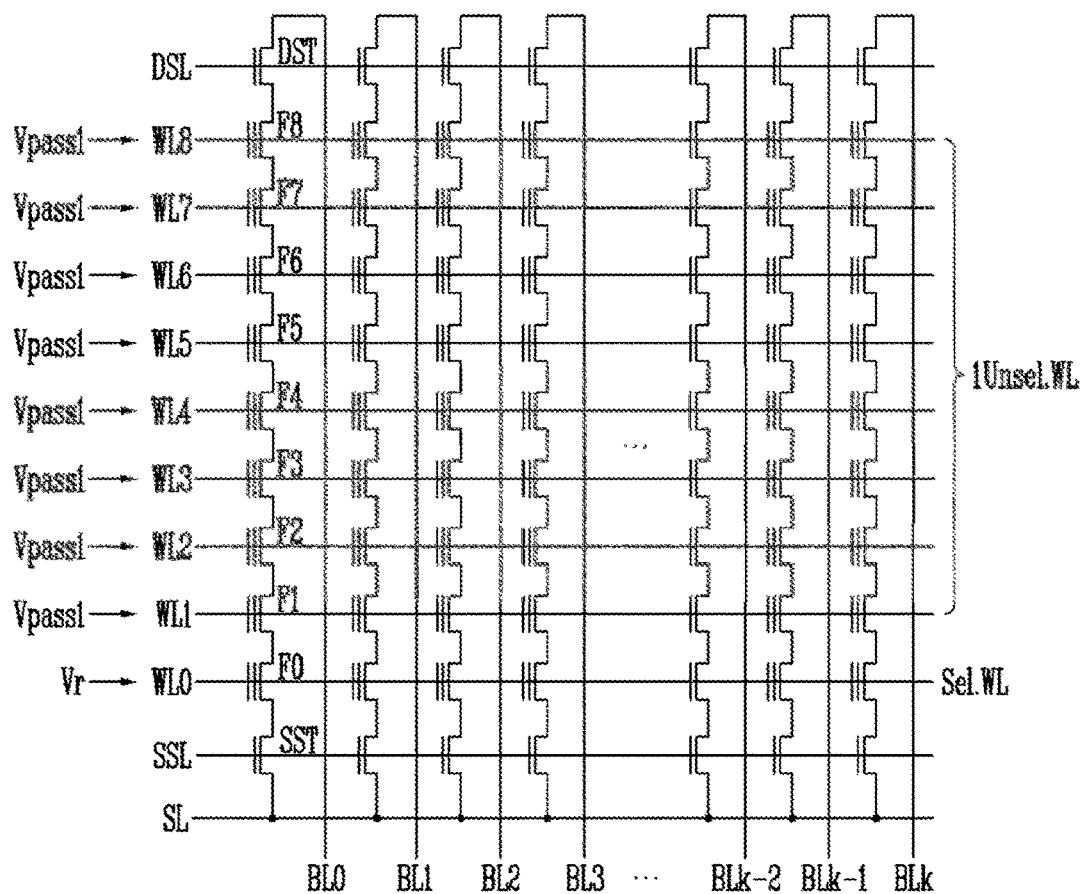
FIGS. 5A to 5C are diagrams illustrating an embodiment of a read operation of a string described in FIG. 4.
Figure 5B:
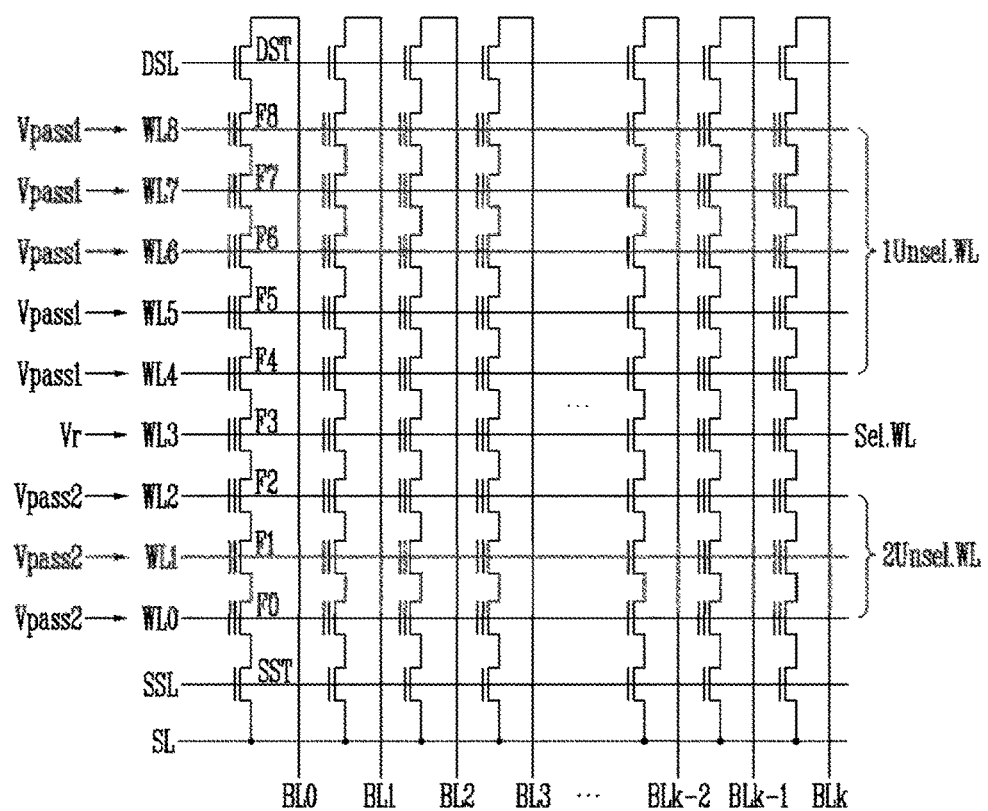
Figure 5C:
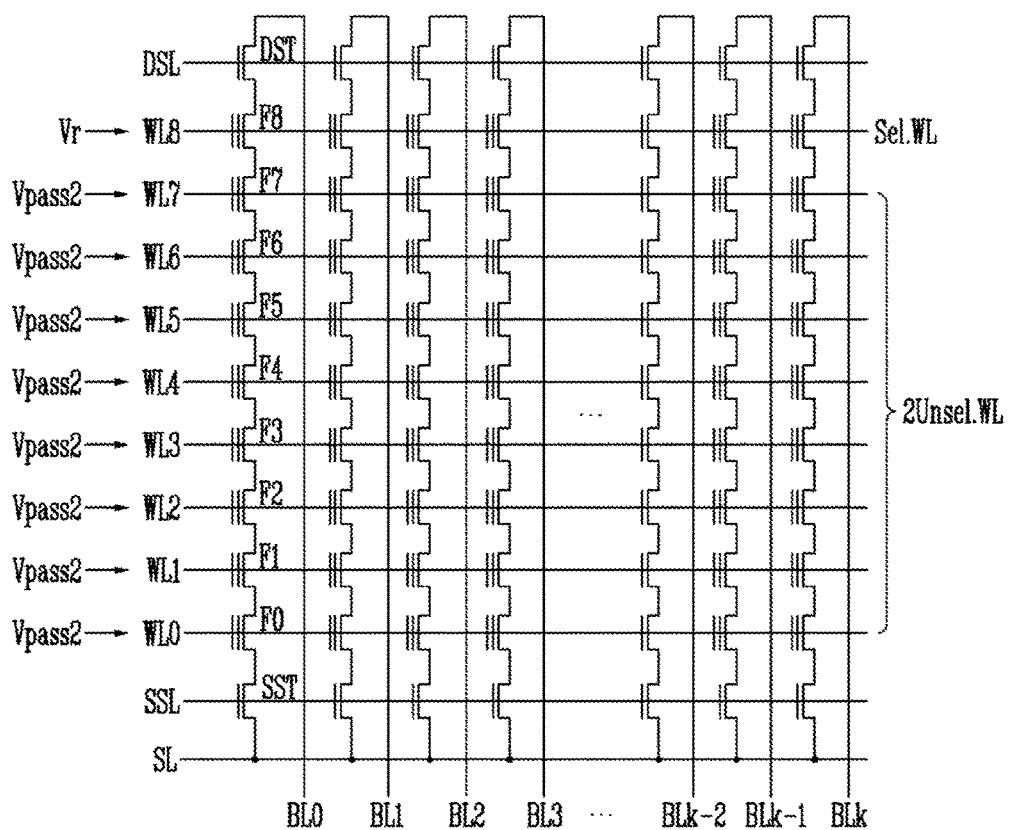

Referring to FIGS. 5A to 5C, diagrams illustrating an embodiment of a read operation of the string described in FIG. 4 are illustrated.

In FIG. 5A, in the read operation according to the embodiment, when a read voltage is applied to a selected word line to which target memory cells are electrically coupled, a pass voltage is applied to the other unselected word lines. Particularly, a pass voltage higher than that applied to unselected word lines disposed between the selected word line and the drain select line is applied unselected word lines disposed between the selected word line and the source select line among the unselected word lines. This will be described in detail as follows.

If a selected word line Sel.WL is a word line adjacent to the source select line SSL, any unselected line is not disposed between the selected word line Sel.WL and the source select line SSL; and therefore, word lines disposed between the selected word line Sel.WL and the drain select line DSL may be defined as first unselected word lines 1Unsel.WL. When a read voltage Vr is applied to the selected word line Sel.WL, a first pass voltage Vpass1 may be applied to the first unselected word lines 1Unsel.WL. The first pass voltage Vpass1 may be set as a positive voltage higher than 0V. When memory cells electrically coupled to the selected word line Sel.WL are read, a turn-on voltage may be selectively applied to the drain select line DSL and the source select line SSL.

In FIG. 5B, if the selected word line Sel.WL is not adjacent to the source select line SSL or the drain select line DSL, when the read voltage Vr is applied to the selected word line Sel.WL, the first pass voltage Vpass1 is applied to the first unselected word lines 1Unsel.WL disposed between the selected word line Sel.WL and the drain select line DSL. In this case, the word lines disposed between the selected word line Sel.WL and the source select line SSL may be defined as second unselected word lines 2Unsel.WL. A second pass voltage Vpass2 higher than the first pass voltage Vpass1 is applied to the second unselected word lines 2Unsel.WL. Thus, the first pass voltage Vpass1 can be set between 0V and the second pass voltage Vpass2.

The reason why the second pass voltage Vpass2 higher than the first pass voltage Vpass1 is applied to the second unselected word lines 2Unsel.WL located in the direction of the source select line SSL based on the selected word line Sel.WL is that, in the read operation, the internal resistance of the string close to the source area may be higher than the internal resistance of the string closed to the drain area. Therefore, pass voltages applied to the drain area and the source area may be asymmetrically applied. When the memory cells electrically coupled to the selected word line Sel.WL are read, a turn-on voltage may be selectively applied to the drain select line DSL and the source select line SSL.

If a higher voltage (i.e., the second pass voltage) is applied to the second unselected word lines 2Unsel.WL located between the selected word line Sel.WL and the source select line SSL, the amount of current in the source area can be increased. If the amount of current is increased, the difference in resistance between the source area and the drain area can be compensated. Thus, the difference in resistance between the source and drain areas of the string is decreased, read disturbance can be prevented. Accordingly, it is possible to improve the reliability of the read operation of the storage device.

Referring to FIG. 5C, if the selected word line Sel.WL is a word line adjacent to the drain select line DSL, any unselected word line is not disposed between the selected word line Sel.WL and the drain select line DSL. In this case, the read voltage Vr is applied to the selected word line Sel.WL. Further, the second pass voltage Vpass2 higher than the first pass voltage Vpass1 may be applied to the other second unselected word lines 2Unsel.WL. When the memory cells electrically coupled to the selected word line Sel.WL are read, a turn-on voltage may be selectively applied to the drain select line DSL and the source select line SSL.

As described above, a higher pass voltage is applied to unselected word lines electrically coupled to the source area based on the selected word line Sel.WL, so that it is possible to increase the amount of current in the source area of the string ST. If the amount of current increases, the distance in resistance between the source and drain areas can be reduced, so that it is possible to improve the reliability of the read operation.

Figure 6A:
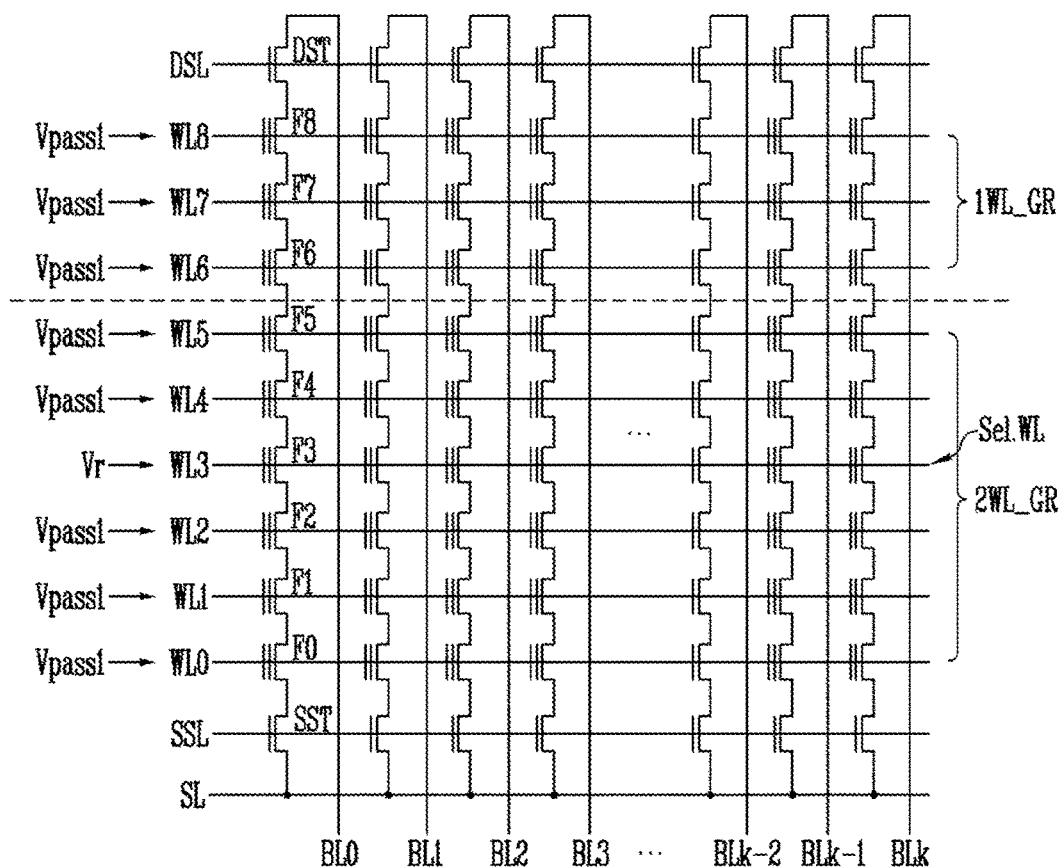
FIGS. 6A and 6B are diagrams illustrating another embodiment of the read operation of the string described in FIG. 4.
Figure 6B:
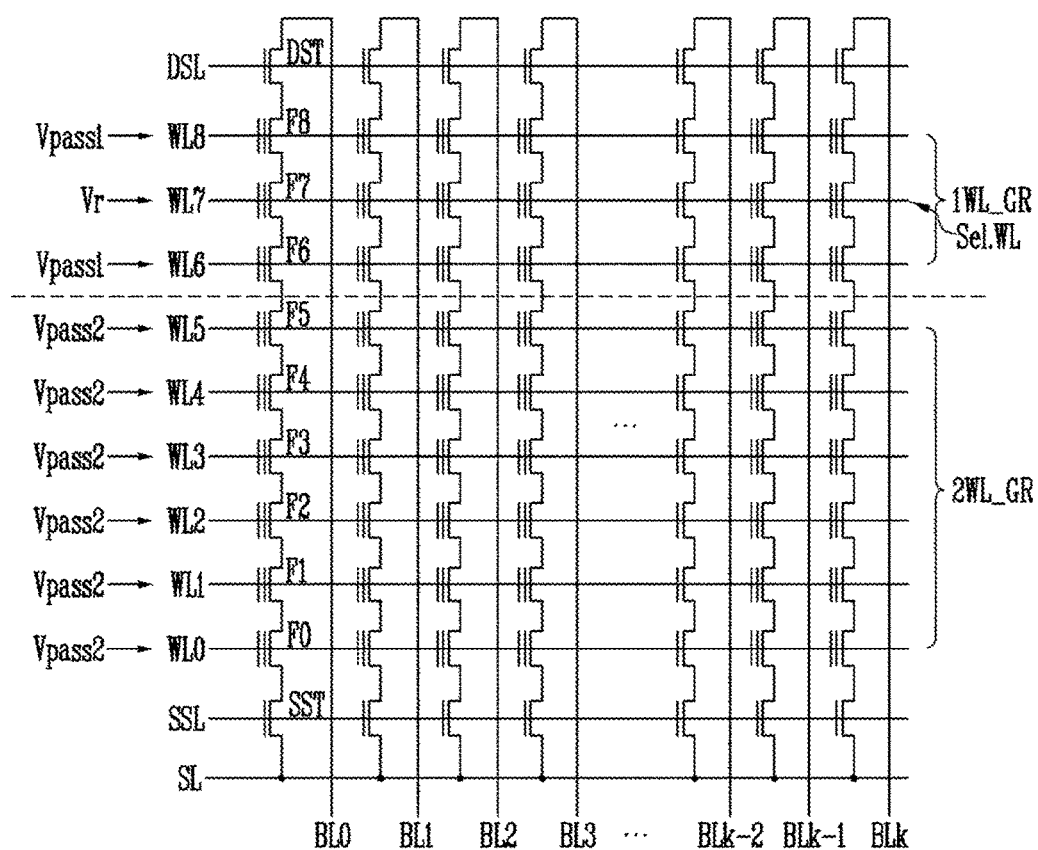

Referring to FIGS. 6A and 6B, diagrams illustrating an embodiment of the read operation of the string described in FIG. 4 are illustrated.

In FIG. 6A, word lines electrically coupled to a selected word line are grouped into a plurality of groups. For example, word lines from a word line adjacent to the drain select line DSL to a kth (k is a positive integer) word line may be defined as a first word line group 1WL_GR. In addition, word lines from a (k+1)th word line to a word line adjacent to the source select word line SSL may be defined as a second word line group 2WL_GR. In particular, the word lines are grouped such that all word lines electrically coupled to the string ST are included in the first word line group 1WL_GR and the second word line group 2WL_GR.

In the read operation, if the selected word line Sel.WL is included in the second word line group 2WL_GR, the first pass voltage Vpass1 is applied to all unselected word lines included in the first word line group 1WL_GR and the second word line group 2WL_GR. More specifically, when the selected word line Sel.WL is included in the second word line group 2WL_GR, regardless of the position of the selected word line Sel.WL, the first pass voltage Vpass1 is applied to all the unselected word lines. This is because, as the selected word line Sel.WL is located closer to the drain select lines DSL, a large difference in resistance between the source and drain areas may occur. In other words, when the selected word line Sel.WL is located distant from the drain area, the difference in resistance between the source and drain areas is small, the first pass voltage Vpass1 is applied to all the unselected word lines.

Thus, the first word line group 1WL_GR and the second word line group 2WL_GR can be set such that the number of word lines included in the second word line group 2WL_GR is greater than the number of word lines included in the first word line group 1WL_GR.

In FIG. 6B, when the selected word line Sel.WL is included in the first word line group 1WL_GR close to the drain area, the first pass voltage Vpass1 may be applied to the unselected word lines included in the first word line group 1WL_GR. In addition, the second pass voltage higher than the first pass voltage may be applied to the unselected word lines included in the second word line group 2WL_GR.

Figure 7:
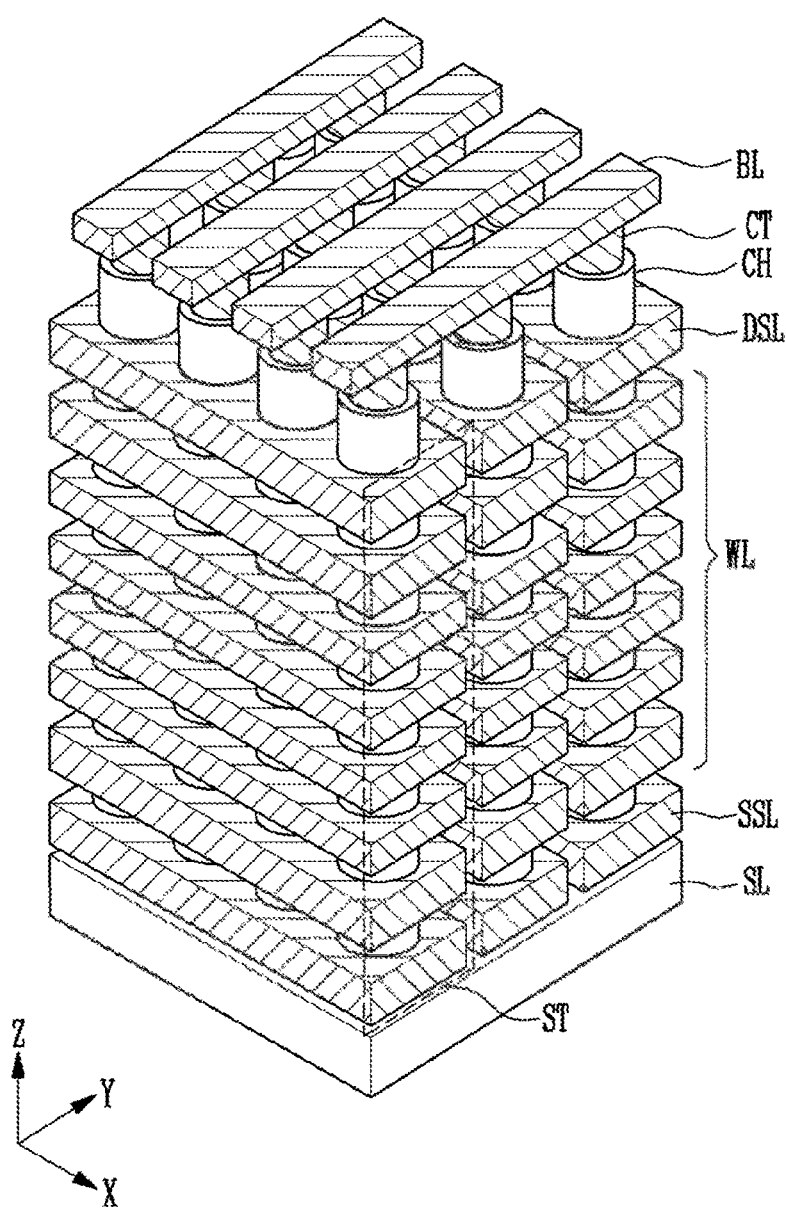
FIG. 7 is a perspective view illustrating an embodiment in which the memory blocks of FIG. 2 are implemented in a three-dimensional structure.

Referring to FIG. 7, a perspective view illustrating an embodiment in which the memory blocks of FIG. 2 are implemented in a three-dimensional structure is described.

In FIG. 7, the memory block implemented in the three-dimensional structure is vertically (Z direction) formed in an I shape on a substrate, and includes strings ST arranged between bit lines BL and a source line SL. This structure is also referred to as a bit cost scalable (BiCS) structure. For example, when the source line SL is horizontally formed over the substrate, the strings ST having the BiCS structure may be formed in the vertical direction over the source line SL. More specifically, the strings ST may include source select lines SSL, word lines WL, and drain select lines DSL, which are arranged in a first direction (Y direction) and stacked to be spaced apart from each other. Since FIG. 7 is view schematically illustrating the strings having the three-dimensional structure, the number of the source select lines SSL, the word lines WL, and the drain select lines DSL may vary according to storage devices. In addition, the strings may include vertical channel layers CH vertically passing through the source select lines SSL, the word lines WL, and the drain select lines DSL, and bit lines BL contacted with top portions of the vertical channel layers CH protruding upward from the drain select lines DSL, the bit lines BL being arranged in a second direction (X direction) perpendicular to the first direction (Y direction). Further, contact plugs CT may be further formed between the bit lines BL and the vertical channel layers CH.

Figure 8A:
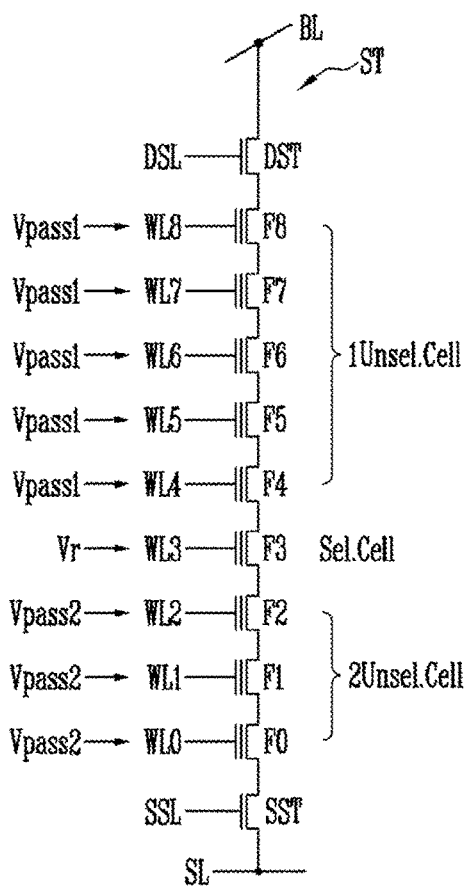
FIGS. 8A and 8B are diagrams illustrating an embodiment of a read operation of a string described in FIG. 7.
Figure 8A:
Figure 8B:
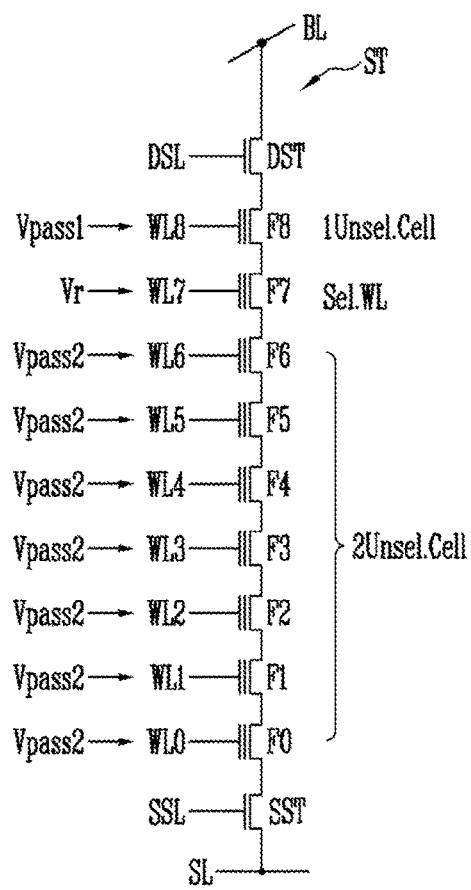
Figure 8B:

Referring to FIGS. 8A and 8B, diagrams illustrating an embodiment of a read operation of the string described in FIG. 7 are illustrated.

In FIG. 8A, in the read operation according to the embodiment, when a read voltage is applied to a selected word line to which a selected memory cell is electrically coupled, a pass voltage is applied to unselected word lines electrically coupled to the other unselected memory cells. In particular, a pass voltage higher than that applied to unselected word lines disposed between the selected word line and the drain select line is applied to unselected word lines disposed between the selected word line and the source select line among the unselected word lines. This will be described in detail as follows.

If a selected memory cell Sel.Cell is a third memory cell F3, a read voltage Vr is applied to a word line WL3 electrically coupled to the selected memory cell Sel.Cell. In this case, memory cells electrically coupled between the selected memory cell Sel.Cell and the drain select line DSL may be defined as first unselected memory cells 1Unsel.Cell. In addition, memory cells electrically coupled between the selected memory cell Sel.Cell and the source select line SSL may be defined as second unselected memory cells 2Unsel.Cell. In order to read the selected memory cell Sel.Cell, when the read voltage Vr is applied to the word line WL3 electrically coupled to the selected memory cell Sel.Cell, a first pass voltage Vpass1 may be applied to word lines WL4 to WL8 electrically coupled to the first unselected memory cells 1Unsel.Cell electrically coupled in the drain direction based on the selected memory cell Sel.Cell. A second pass voltage Vpass2 higher than the first pass voltage Vpass1 may be applied to word lines WL0 to WL2 electrically coupled to the second unselected memory cells 2Unsel.Cell electrically coupled in the source direction based on the selected memory cell Sel.Cell. The first pass voltage Vpass1 may be set as a positive voltage higher than 0V. Since the first pass voltage Vpass1 is lower than the second pass voltage Vpass2, the first pass voltage Vpass1 may be set between 0V and the second pass voltage Vpass2.

While the selected memory cell Sel.Cell is being read, a turn-on voltage having a positive voltage may be selectively applied to the drain select line DSL and the source select line SSL.

In FIG. 8B, if the selected memory cell Sel.Cell is a seventh memory cell F7, a memory cell F8 electrically coupled between the selected memory cell Sel.Cell and the drain select line DSL may be defined as a first unselected memory cell 1Unsel.Cell. Further, memory cells F0 to F6 electrically coupled between the selected memory cell Sel.Cell and the source select line SSL may be defined as second unselected memory cells 2Unsel.Cell. In order to read the selected memory cell Sel.Cell, when the read voltage Vr is applied to a word line WL7 electrically coupled to the selected memory cell Sel.Cell, the first pass voltage Vpass1 may be applied to a word line WL8 electrically coupled to the first unselected memory cell 1Unsel.Cell included in the drain area based on the selected memory cell Sel.Cell. In addition, the second pass voltage Vpass2 higher than the first pass voltage Vpass1 may be applied to word lines WL0 to WL6 electrically coupled to the second unselected memory cells 2Unsel.Cell included in the source area based on the selected memory cell Sel.Cell.

As described above, if the second pass voltage Vpass2 higher than the first pass voltage Vpass1 is applied to the word lines WL0 to WL6 electrically coupled to the second unselected memory cells 2Unsel.Cell included in the source area based on the selected memory cell Sel.Cell, the amount of current in the source area can be increased. If the amount of current is increased, the difference in resistance between the source and drain areas in the string ST can be reduce. If the difference in resistance in the string ST decreases, read disturbance can be reduced, and thus it is possible to improve the reliability of the read operation of the storage device.

Figure 9A:
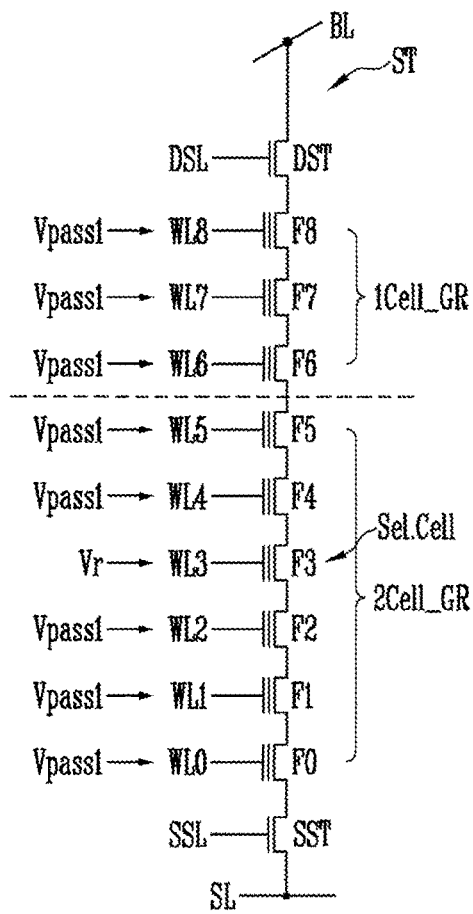
FIGS. 9A and 9B are diagrams illustrating an embodiment of the read operation of the string described in FIG. 7.
Figure 9B:
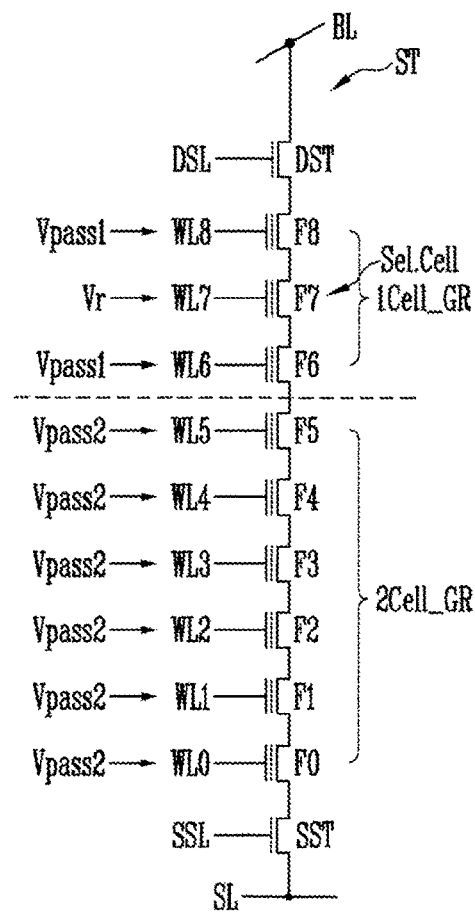

Referring to FIGS. 9A and 9B, diagrams illustrating an embodiment of the read operation of the string described in FIG. 7 is described.

In FIG. 9A, memory cells F0 to F8 included in a selected memory block are grouped into a plurality of groups. For example, eighth to sixth memory cells F8 to F6 located close to the drain select transistor DST may be defined as a first memory cell group 1Cell_GR. Further, fifth to zeroth memory cells F5 to F0 located close to the source select transistor SST may be defined as a second memory cell group 2Cell_GR. That is, the memory cells F0 to F8 are grouped such that all the memory cells F0 to F8 electrically coupled to the string ST are included in the first memory cell group 1Cell_GR and the second memory cell group 2Cell_GR.

In the read operation, if a selected memory cell Sel.Cell is included in the second memory cell group 2Cell_GR located close to the source area, a first pass voltage Vpass1 is applied to all unselected word lines.

For example, in the read operation, when a third memory cell F3 included in the second memory cell group 2Cell_GR is the selected memory cell Sel.Cell, a read voltage Vr is applied to a word line WL3 electrically coupled to the selected memory cell Sel.Cell, and the first pass voltage Vpass1 is applied to word lines WL0 to WL2 and WL4 to WL8 electrically coupled to unselected memory cells F0 to F2 and F4 to F8 included in the second memory cell group 2Cell_GR and the first memory cell group 1Cell_GR. The first pass voltage Vpass1 may be set as a positive voltage higher than 0V.

In FIG. 9B, if a selected word line Sel.WL is included in the first memory cell group 1Cell_GR located close to the drain area, different pass voltages are applied to unselected word lines electrically coupled to the first memory cell group 1Cell_GR and unselected word lines electrically coupled to the second memory cell group 2Cell_GR.

For example, in the read operation, when a seventh memory cell F7 included in the first memory cell group 1Cell_GR is the selected memory cell Sel.Cell, the read voltage Vr is applied to a word line WL7 electrically coupled to the selected memory cell Sel.Cell. In addition, the first pass voltage Vpass1 is applied to word lines WL8 to WL6 electrically coupled to unselected memory cells included in the first memory cell group 1Cell_GR. Further, a second pass voltage Vpass2 higher than the first pass voltage Vpass1 is applied to word lines WL0 to WL5 electrically coupled to unselected memory cells F0 to F5 included in the second memory cell group 2Cell_GR. The second pass voltage Vpass2 is a positive voltage higher than the first pass voltage Vpass1, and thus the first pass voltage Vpass1 can be set between 0V and the second pass voltage Vpass2.

Figure 10:
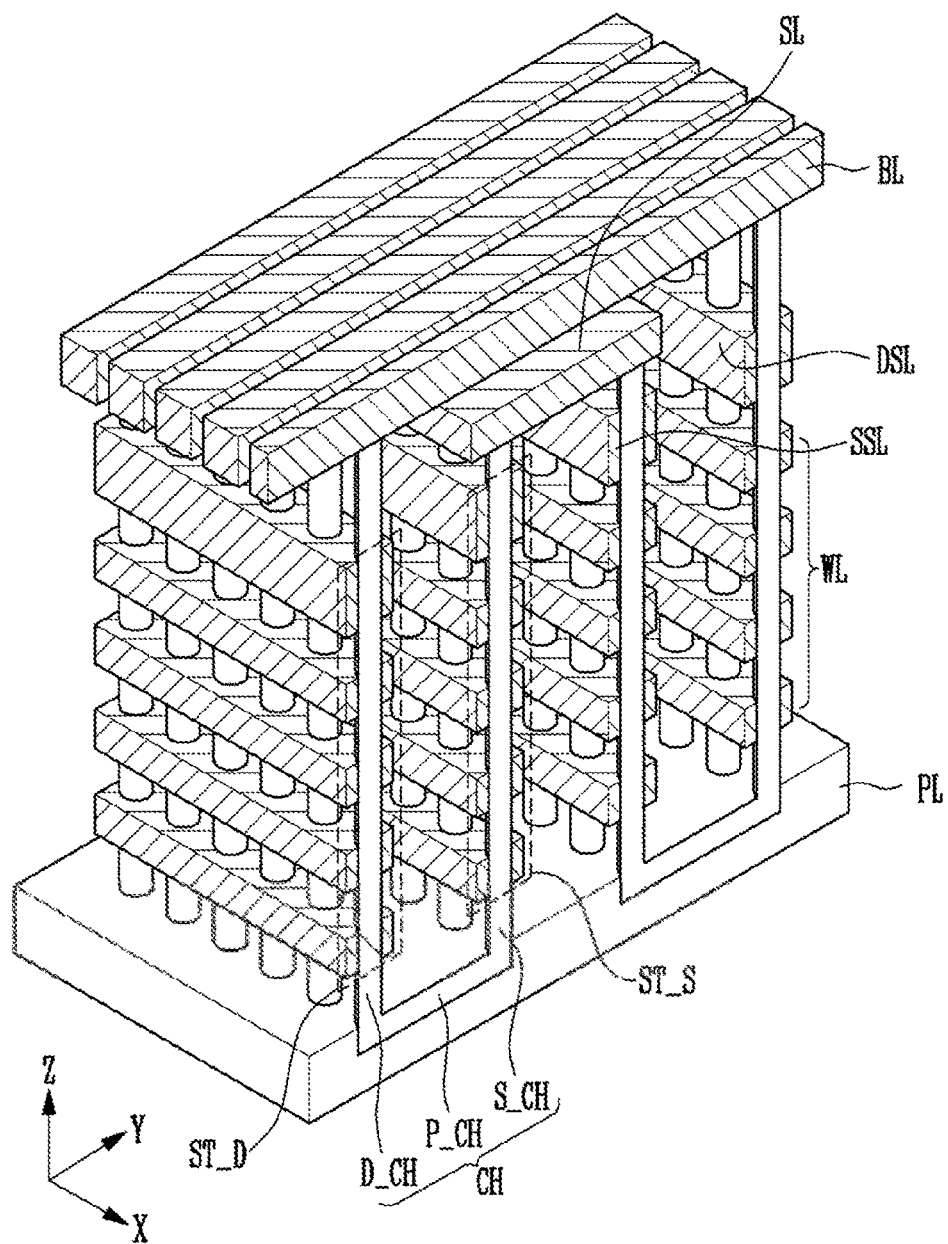
FIG. 10 is a perspective view illustrating an embodiment in which the memory blocks of FIG. 2 are implemented in the three-dimensional structure.

Referring to FIG. 10, a perspective view illustrating an embodiment in which the memory blocks of FIG. 2 are implemented in the three-dimensional structure is described.

In FIG. 10, the memory block implemented in the three-dimensional structure includes strings formed vertically (Z direction) on a substrate, the strings being arranged between bit lines BL and a source line SL, and a pipe structure electrically coupling two strings to each other. For example, the two strings may be formed in a U shape in which their bottom ends are connected to each other.

More specifically, the strings may be formed into a structure in which first sub-strings vertically arranged between the bit lines BL and a pipe line PL and second sub-strings vertically arranged between the source line SL and the pipe line PL are electrically coupled to each other in an area of the pipe line PL. This structure is also referred to as a pipe-shaped bit cost scalable (P-BiCS) structure.

For example, when the pipe line PL is horizontally formed over the substrate, the strings having the P-BiCS structure may include first sub-strings ST_D arranged between the pipe line PL and the bit line BL, and second sub-strings ST_S arranged between the pipe line PL and the source line SL.

More specifically, the first sub-string ST_D includes word lines WL and a drain select line DSL, which are arranged in a first direction (Y direction) and stacked to be spaced apart from each other, and a first vertical channel layer D_CH vertically passing through the word lines WL and the drain select line DSL. The second sub-string ST_S includes word lines WL and a source select line SSL, which are arranged in the first direction (Y direction) and stacked to be spaced apart from each other; and a second vertical channel layer S_CH vertically passing through the word lines WL and the source select line SSL. The first vertical channel layer D_CH and the second vertical channel layer S_CH are electrically coupled to each other by a pipe channel layer P_CH in the pipe line PL. The bit lines BL are contacted with a top portion of the first vertical channel layer D_CH protruding upward from the drain select line DSL and arranged in a second direction (X direction) perpendicular to the first direction (Y direction).

Figure 11A:
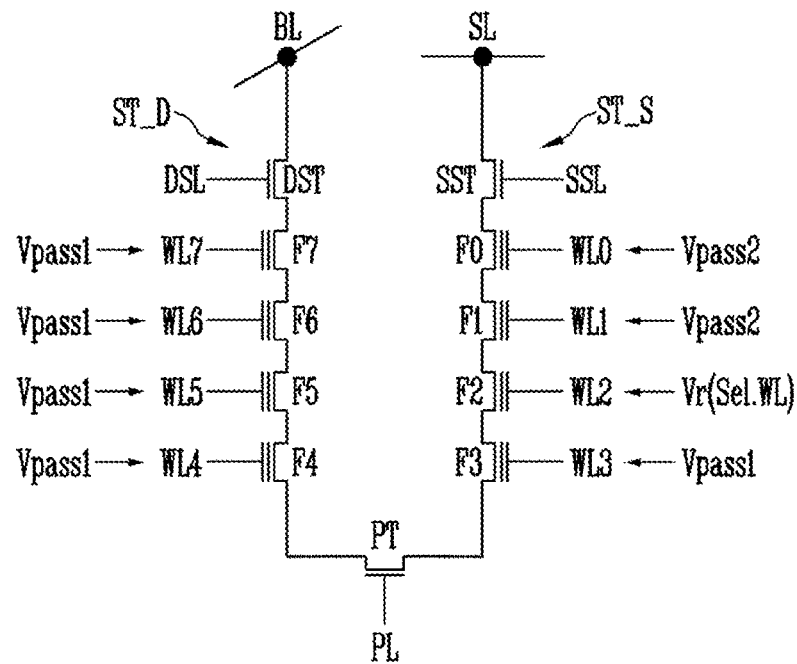
FIGS. 11A and 11B are diagrams illustrating an embodiment of a read operation of a string described in FIG. 10.
Figure 11B:
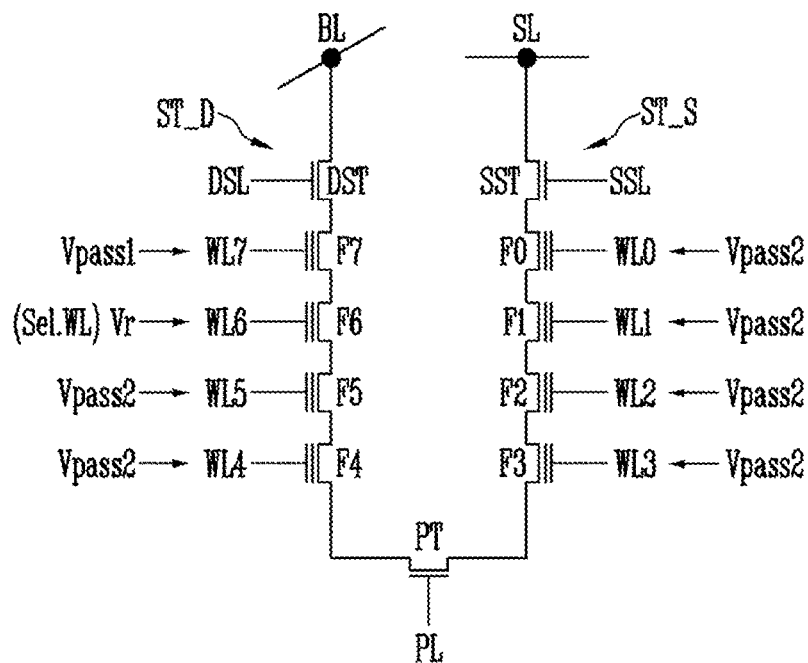

Referring to FIGS. 11A and 11B, diagrams illustrating an embodiment of a read operation of the string described in FIG. 10 are illustrated.

In FIG. 11A, in the read operation according to an embodiment, when a read voltage is applied to a selected word line, a pass voltage is applied to the other unselected word lines. In particular, a pass voltage higher than that applied to unselected word lines disposed between the selected word line and the drain select line is applied to unselected word lines disposed between the selected word line and the source select line among the unselected word lines. FIGS. 11A and 11B also illustrate a pipe transistor PT.

If a second word line F2 is a selected word line Sel.WL, when a read voltage Vr is applied to the selected word line Sel.WL, a first pass voltage Vpass1 may be applied to unselected word lines WL3 to WL7 electrically coupled between the selected word line Sel.WL and the drain select line DSL. Further, a second pass voltage Vpass1 higher than the first pass voltage Vpass1 may be applied to unselected word lines WL0 and WL1 electrically coupled between the selected word line Sel.WL and the source select line SSL. If the second pass voltage Vpass2 higher than the first pass voltage Vpass1 is applied to the unselected word lines WL0 and WL1 electrically coupled between the selected word line Sel.WL and the source select line SSL, the amount of current in the source area based on the selected word line Sel.WL can be increased. Thus, the difference in resistance between the source and drain areas can be reduced. The first pass voltage Vpass1 is a positive voltage higher than 0V and lower than the second pass voltage Vpass2. Thus, the first pass voltage Vpass1 can be set between 0V to the second pass voltage Vpass2.

When the read voltage Vr is applied to the selected word line Sel.WL, a turn-on voltage having a positive voltage may be selectively applied to the drain select line DSL, the source select line SSL, and the pipe line PL.

In FIG. 11B, if a sixth word line WL6 is a selected word line Sel.WL, when the read voltage Vr is applied to the selected word line Sel.WL, the first pass voltage Vpass1 may be applied to an unselected word line WL7 electrically coupled between the selected word line Sel.WL and the drain select line DSL, the second pass voltage Vpass2 higher than the first pass voltage Vpass1 may be applied to unselected word lines WL0 to WL5 electrically coupled between the selected word line Sel.WL and the source select line SSL. If the second pass voltage Vpass2 higher than the first pass voltage Vpass1 is applied to the unselected word lines WL0 to WL5 electrically coupled between the selected word line Sel.WL and the source select line SSL, the amount of current in the source area based on the selected word line Sel.WL can be increased.

As described above, if the second pass voltage Vpass1 higher than the first pass voltage Vpass1 is applied to unselected word lines included in the source area based on the selected word line Sel.WL, the amount of current in the source area can be increased. If the amount of current is increased, it is possible to reduce a difference in electrical characteristic due to the difference in resistance between the source and drain areas in the string ST. If the difference in resistance is reduced in the string ST, read disturbance can be reduced, so that it is possible to improve the reliability of the read operation of the storage device.

Figure 12A:
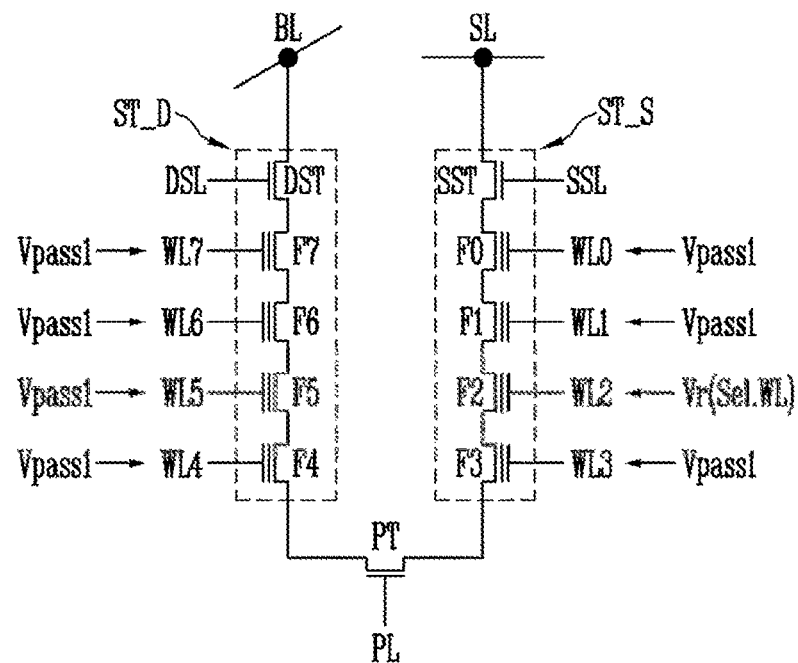
FIGS. 12A and 12B are diagrams illustrating an embodiment of the read operation of the string described in FIG. 10.
Figure 12B:
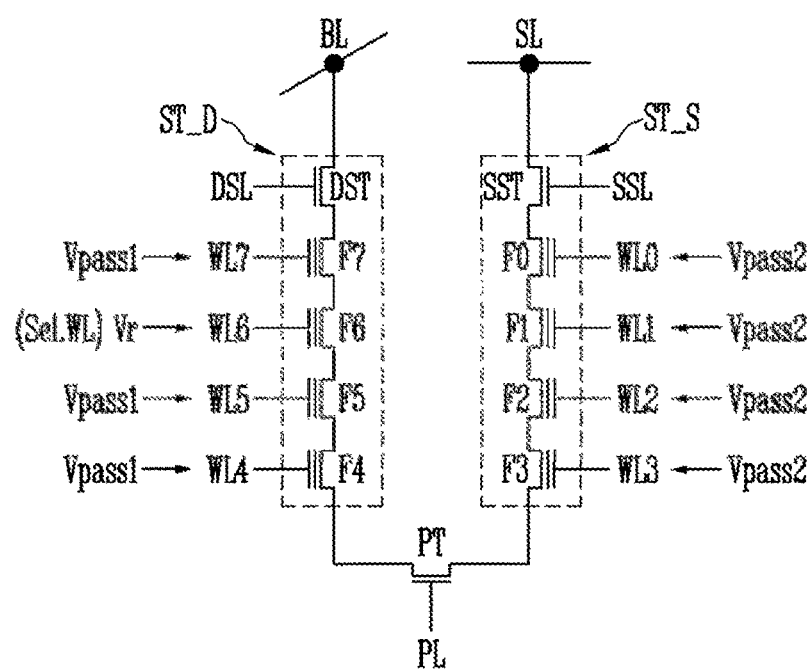

Referring to FIGS. 12A and 12B, diagrams illustrating an embodiment of the read operation of the string described in FIG. 10 are described.

In FIG. 12A, in the read operation according to an embodiment, the pass voltage applied to unselected word lines may be adjusted according to a string including a selected word line Sel.WL.

More specifically, if the selected word line Sel.WL is electrically coupled to the second sub-string ST_S formed in the source area, a first pass voltage Vpass1 is applied to all unselected word lines when a read voltage Vr is applied to the selected word line Sel.WL. If the selected word line Sel.WL is electrically coupled to the first sub-string (ST_D) formed in the drain area, different pass voltages are applied to unselected word lines respectively electrically coupled to the first sub-string ST_D and the second sub-string ST_S when the read voltage Vr is applied to the selected word line Sel.WL.

A case where the selected word line Sel.WL is electrically coupled to the second sub-string ST_S will be described in detail as follows.

If the selected word line Sel.WL is a second word line WL2 among the word lines WL0 to WL3 electrically coupled to the second sub-string ST_S, when the read voltage is applied to the second word line WL2, the first pass voltage Vpass1 is applied to all the unselected word lines WL0, WL1, and WL3 to WL7 electrically coupled to the first and second sub-strings ST_D and ST_S.

That is, when the selected word line Sel.WL is electrically coupled to the second sub-string ST_S formed in the source area, the first pass voltage Vpass1 is applied to the other unselected word lines while the memory cells electrically coupled to the selected word line Sel.WL are being read, regardless of the position of the selected word line Sel.WL. The first pass voltage Vpass1 may be set as a positive voltage higher than 0V.

A case where the selected word line Sel.WL is electrically coupled to the first sub-string ST_D will be described in detail with reference to FIG. 12B.

If the selected word line Sel.WL is a sixth word line among the word lines WL4 to WL7 electrically coupled to the first sub-string ST_D, when the read voltage Vr is applied to the sixth word line WL6, the first pass voltage Vpass1 is applied to unselected word lines WL4, WL5, and WL7 electrically coupled to the first sub-string ST_D. Further, a second pass voltage Vpass2 higher than the first pass voltage Vpass1 is applied to unselected word lines WL0 to WL3 electrically coupled to the second sub-string ST_S.

When the selected word line Sel.WL is electrically coupled to the first sub-string ST_D formed in the drain area, the first pass voltage Vpass1 is applied to the unselected word lines WL4, WL5, and WL7 electrically coupled to the first sub-string ST_D while the memory cells electrically coupled to the selected word line Sel.WL are being read, regardless of the position of the selected word line Sel.WL. Further, the second pass voltage Vpass2 higher than the first pass voltage Vpass1 is applied to the unselected word lines WL0 to WL3 electrically coupled to the second sub-string ST_S.

As described above, if the second pass voltage Vpass2 higher than the first pass voltage Vpass1 is applied to the unselected word lines WL0 to WL3 electrically coupled to the second sub-string ST_S while the memory cells electrically coupled to the selected word line Sel.WL are being read, the amount of current in the second sub-string ST_S can be increased. Accordingly, it is possible to reduce a difference in electrical characteristic due to the difference in resistance between the first and second sub-strings ST_D and ST_S. If the difference in electrical characteristic between the first and second sub-strings ST_D and ST_S electrically coupled to each other is reduced, read disturbance can be reduced, and thus it is possible to improve the reliability of the read operation of the storage device.

Figure 13:
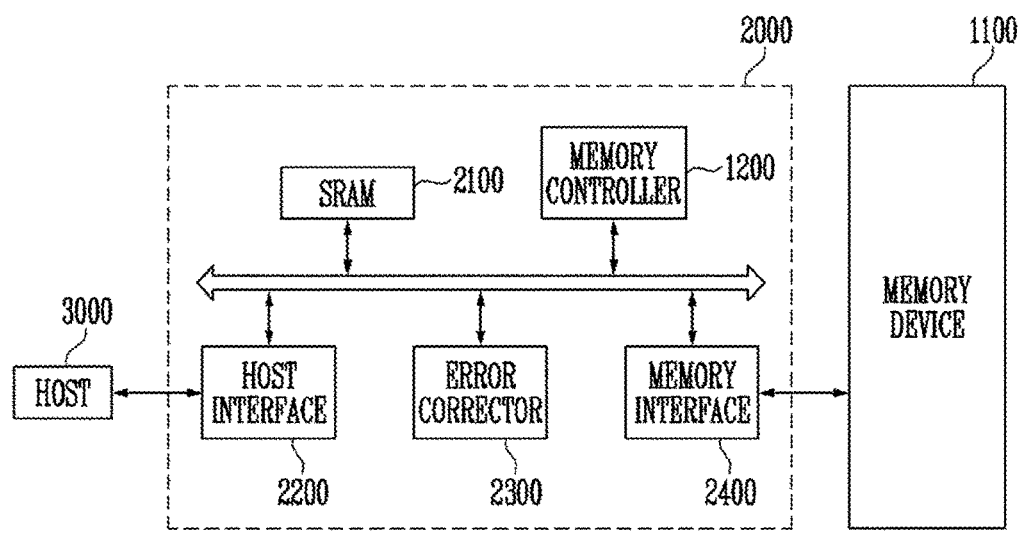
FIG. 13 is a diagram illustrating a memory system according to an embodiment of the invention.

Referring to FIG. 13, a diagram illustrating a memory system according to an embodiment of the invention is described.

In FIG. 13, the memory system according to an embodiment of the invention may include a memory device 1100, a controller 2000, and a host 3000.

The controller 2000 may include a memory controller 1200, an SRAM 2100, a host interface 2200, an error corrector 2300, and a memory 2400.

The memory controller 1200 may be configured to control the memory device 1100. The SRAM 2100 may be used as a working memory of a CPU 3120. The host interface 2200 may be provided with a data exchange protocol of the host 3000 electrically coupled to the controller 2000. The error corrector 2300 may detect and correct errors included in data read out from the memory device 1100. The memory interface 2400 may interface with the memory device 1100. The memory controller 1200 may perform a control operation for data exchange between the controller 2000 and the memory device 1100. Although not shown in this figure, the controller 200 may further include a ROM for storing code data for interfacing with the host 3000.

The memory system may be applied to a computer, a ultra mobile PC (UMPC), a workstation, a net-book, a personal digital assistant (PDA), a portable computer, a web tablet, a wireless phone, a mobile phone, a smart phone, a digital camera, a digital audio recorder, a digital audio player, a digital video recorder, a digital video player, a device capable of transmitting/receiving information in a wireless environment, and one of various electronic devices that constitute a home network.

Figure 14:
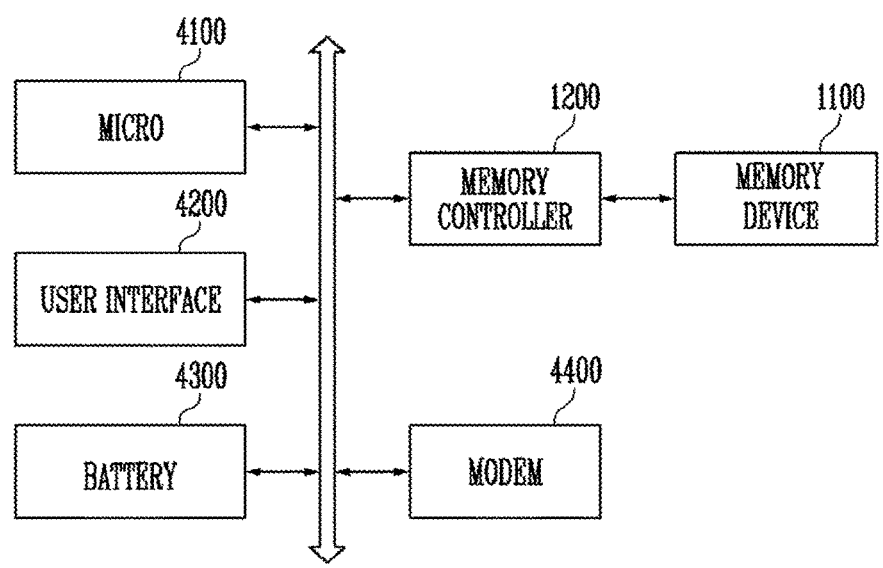
FIG. 14 is a diagram illustrating a memory system according to an embodiment of the invention.

Referring to FIG. 14, a diagram illustrating a memory system according to an embodiment of the invention is described.

In FIG. 14, the memory system includes a memory device 1100, a memory controller 1200, a micro 4100, and a user interface 4200, which are electrically coupled to a bus. A modem 4400 is also illustrated. When the memory system is a mobile device, a battery 4300 for supplying operation voltages of the memory system may be additionally provided in the memory system. Although not shown in this figure, the memory system may further include an application chip set, a camera image processor (CIS), a mobile DRAM, and the like.

The memory device 1100 and the memory controller 1200 may be packaged in various forms. For example, the semiconductor device and the memory controller may be packaged in a manner such as package on package (PoP), ball grid arrays (BGAs), chip scale packages (CSPs), plastic leaded chip carrier (PLCC), plastic dual in-line package (PDIP), die in Waffle pack, die in wafer form, chip on board (COB), ceramic dual in-line package (CERDIP), plastic metric quad flat pack (MQFP), thin quad flat pack (TQFP), small outline integrated circuit (SOIC), shrink small out line package (SSOP), thin small outline package (TSOP), thin quad flat pack (TQFP), system in package (SIP), multi chip package (MCP), wafer-level fabricated package (WFP), or wafer-level processed stack package (WSP).

According to the invention, in a read operation, a high pass voltage is applied to unselected word lines located in the direction of the source line based on a selected memory cell or a selected word line, so that current in a string can be increased in the read operation, thereby improving the reliability of the read operation.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the invention, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the invention as set forth in the following claims.

What is claimed is:

1. A storage device comprising:
a string configured to include a first memory cell group and a second memory cell group, wherein the first memory cell group is adjacent to a drain select transistor, and the second memory cell group is adjacent to a source select transistor;
peripheral circuits configured to, in a read operation of a selected memory cell included in the first or the second memory cell group, apply a read voltage to a selected word line electrically coupled to the selected memory cell, and selectively apply a first pass voltage and a second pass voltage higher than the first pass voltage to unselected word lines electrically coupled to unselected memory cells,
wherein the first pass voltage is applied to all the unselected word lines when the selected memory cell is included in the second memory cell group, and applied to unselected word lines electrically coupled to the first memory cell group when the selected memory cell is included in the first memory cell group, and the second pass voltage is applied to unselected word lines electrically coupled to the second memory cell group when the selected memory cell is included in the first memory cell group; and
a controller configured to control the peripheral circuits.

2. The storage device of claim 1, wherein the peripheral circuits include:
a voltage generation circuit configured to generate the read voltage, the first pass voltage, or the second pass voltage in response to an operation signal;
a row decoder configured to transmit a voltage generated by the voltage generation circuit to the selected word line and the unselected word lines in response to a row address;
a column decoder configured to transmit/receive data through a bit line electrically coupled to the string in response to a column address; and
an input/output circuit configured to receive a command from an outside source or device to transmit the received command to the controller or transmit/receive data to/from the outside source or device.

3. The storage device of claim 1, wherein the string is formed into a two-dimensional structure in which the memory cells are horizontally arranged on a substrate, a three-dimensional structure in which the memory cells are vertically stacked in an I shape on the substrate, or a three-dimensional structure in which the memory cells are vertically stacked in a U shape on the substrate.

4. The storage device of claim 3, wherein, when the string is formed into the two-dimensional structure or formed in the I shape, the controller controls the peripheral circuits to:
apply the read voltage to the selected word line;
apply the second pass voltage to the unselected word lines electrically coupled to the second memory cell group; and
apply the first pass voltage to all the unselected word lines or the unselected word lines electrically coupled to the first memory cell group.

5. The storage device of claim 3, wherein, when the string is formed into the two-dimensional structure or formed in the I shape or U shape, the controller controls the peripheral circuits to:
divide the string into the first and second memory cell groups according to a resistance of the string, wherein the first memory cell group corresponds to a low resistance area and the second memory cell group corresponds to a high resistance area;
apply the read voltage to the selected word line;
if the selected word line is included in the second memory cell group, apply the first pass voltage to all the unselected word lines; and
if the selected word line is included in the first memory cells group, apply the second pass voltage to the unselected word lines included in the second memory cell group, and apply the first pass voltage to the unselected word lines included in the first memory cell group.

6. A storage device comprising:
a first memory cell group and a second memory cell group which are electrically coupled between a drain select transistor and a source select transistor;
peripheral circuits configured to perform a read operation of a selected memory cell included in the first or second memory cell group; and
a controller configured to control the peripheral circuits to, in the read operation, apply a first pass voltage, a second pass voltage, or the first and second pass voltages to unselected word lines electrically coupled to unselected memory cells according to a memory cell group between the first and second memory cell groups including the selected memory cell,
wherein the first pass voltage is applied to all the unselected word lines when the selected memory cell is included in the second memory cell group, and applied to unselected word lines electrically coupled to the first memory cell group when the selected memory cell is included in the first memory cell group, and the second pass voltage is applied to the unselected word lines when the selected memory cell is included in the first memory cell group.

7. The storage device of claim 6, wherein the controller groups, as the first memory cell group, the memory cells adjacent to the drain select transistor among the memory cells, and groups, as the second memory cell group, the other memory cells adjacent to the source select transistor, and
wherein the controller controls the peripheral circuits to adjust a voltage applied to the unselected word lines according to a group including the selected memory cell among the first and second memory cell groups.

8. The storage device of claim 7, wherein, if the selected memory cell is included in the first memory cell group, the controller controls the peripheral circuits to apply the first pass voltage to the unselected word lines electrically coupled to the first memory cell group, and apply the second pass voltage to the unselected word lines electrically coupled to the second memory cell group.

9. The storage device of claim 7, wherein, if the selected memory cell is included in the second memory cell group, the controller controls the peripheral circuits to apply the first pass voltage to the all unselected word lines.

10. A method of operating a storage device, the method comprising:
- grouping memory cells adjacent to a drain area of a string including a selected memory cell as a first memory cell group;
- grouping the other memory cells adjacent to a source area of the string as a second memory cell group;
- reading the selected memory cell; and
- adjusting a pass voltage applied to unselected word lines electrically coupled to unselected memory cells according to a memory cell group between the first and second memory cell groups including the selected memory cell,
- wherein, the first pass voltage is applied to all the unselected word lines when the selected memory cell is included in the second memory cell group, and applied to unselected word lines electrically coupled to the first memory cell group when the selected memory cell is included in the first memory cell group, and the second pass voltage is applied to unselected word lines electrically coupled to the second memory cell group when the selected memory cell is included in the first memory cell group.

* * * * *